United States Patent [19]

Ichikawa et al.

[11] Patent Number: 5,298,747
[45] Date of Patent: Mar. 29, 1994

[54] SCANNING INTERFERENCE ELECTRON MICROSCOPY

[75] Inventors: Masakazu Ichikawa, Tokyo; Yusuke Yajima, Kokubunji; Masatoshi Takeshita, Iruma; Toshio Kobayashi, Hinode, all of Japan

[73] Assignee: Hitachi, Ltd., Tokyo, Japan

[21] Appl. No.: 794,007

[22] Filed: Nov. 19, 1991

[30] Foreign Application Priority Data

Nov. 29, 1990 [JP] Japan .................................. 2-325988

[51] Int. Cl.$^5$ .............................................. H01J 37/26
[52] U.S. Cl. .................................... 250/306; 250/307; 250/311
[58] Field of Search ................ 250/306, 307, 311, 310

[56] References Cited

U.S. PATENT DOCUMENTS

| 4,935,625 | 6/1990 | Hasegawa et al. | 250/306 |
| 4,998,788 | 3/1991 | Osakabe et al. | 250/306 |
| 5,004,918 | 4/1991 | Tsuno et al. | 250/307 |

FOREIGN PATENT DOCUMENTS 456219A 11/1991 European Pat. Off. ............ 250/306

OTHER PUBLICATIONS

"Physical Review B", vol. 25, No. 11, Jun. 1982, pp. 6799–6804.
"Journal of Applied Physics", vol. 64, No. 10, Nov. 1988, pp. 6011–6013.

Primary Examiner—Paul M. Dzierzynski
Assistant Examiner—Kiet T. Nguyen
Attorney, Agent, or Firm—Fay, Sharpe, Beall, Fagan, Minnich & McKee

[57] ABSTRACT

A scanning interference electron microscope includes an electron source, a focusing lens, an electron beam deflection system and a biprism. The biprism separates the primary electron beam emanating from the electron source into two beams. One of the separated beams is controlled by the deflection system to scan the sample surface, thereafter interfering with the other separated beam to generated interference fringes. The phase difference due to interaction of the first electron beam with a sample surface produces changes in the interference intensity of the interference fringes, which represent a microscopic image of the sample.

8 Claims, 4 Drawing Sheets

SCANNING INTERFERENCE ELECTRON MICROSCOPY

BACKGROUND OF THE INVENTION

The present invention relates to improvements in scanning interference electron microscopy for evaluating the magnetic property of micro-areas in magnetic materials. More particularly, the invention relates to a scanning interference electron microscope which operates on a novel signal detection method for higher detection sensitivity and which is functionally enhanced to analyze ever smaller parts of the sample.

In recent years, various attempts have been made to evaluate the magnetic property of micro-areas in magnetic materials through the use of electron microscopes. Two kinds of electron microscopes have been primarily used in such cases: holography electron microscopes, and scanning transmission electron microscopes that utilize phase difference contrast. A typical holography electron microscope is described in "PHYSICAL REVIEW B," Vol. 25, No. 11, pages 6799–6804 (June 1982). This holography electron microscope operates as follows: A primary electron beam is irradiated onto a wide area covering the inside as well as the outside of a sample. Part of the electron beam is transmitted inside the sample, and part thereof is allowed to pass outside the sample. An electron biprism causes the two electron beam parts to interfere with each other, generating interference fringes. A position difference of the interference fringes is then detected. This difference represents a phase difference of the electron beam as it interacts with the sample while passing therethrough. Because the phase difference is particularly pronounced in response to magnetic field changes, the holography microscope can evaluate with high sensitivity the magnetic property of micro-areas in the magnetic sample under observation.

Meanwhile, a typical scanning transmission electron microscope is discussed in "JOURNAL OF APPLIED PHYSICS," Vol. 64, No. 10, pages 6011–6013 (Nov. 1988). This electron microscope works as follows: A primary electron beam is irradiated and focused on the surface of a sample. An electron beam deflection system causes the irradiated spot of the electron beam to scan the sample surface, generating what is known as a scanning transmission electron microscopic image. Viewing the image, the observer determines on the sample surface a point to be evaluated. When the primary electron beam is irradiated onto that point, the Lorentz force arising from the magnetic field within the sample deflects the beam. The deflection angle of the electron beam is then measured. The measurements permit evaluation of the magnetic property of micro-areas in the sample being observed. Since the primary electron beam is focused when irradiated onto the sample, an electron diffraction pattern and fluorescent X-rays are also detected from the irradiated spot of the beam on the sample surface. These findings allow micro-areas in the sample to be evaluated in terms of crystalline quality and element composition concurrently with magnetic property observation.

Although conventional electron microscopes provide, as described, effective means for evaluating the magnetic property of micro-areas in magnetic materials, they have some conspicuous disadvantages. One disadvantage of the holography electron microscope is that the crystalline property and element composition of micro-areas in the sample cannot be evaluated concurrently with the magnetic property thereof. This is because the primary electron beam of the holography electron microscope is not focused but expanded over a wide area of the sample surface. On the other hand, one disadvantage of the scanning transmission electron microscope based on phase difference contrast is its poor capability to precisely measure magnetic fields with high sensitivity. The reason for this is that, with the scanning transmission electron microscope, the angle of deflection of the primary electron beam caused by the Lorentz force from the magnetic field within the sample is as small as $10^{-4}$ to $10^{-5}$ rad.

SUMMARY OF THE INVENTION

It is therefore an object of the present invention to provide a scanning interference electron microscope that is functionally enhanced to measure and evaluate the magnetic property of micro-areas in samples with high sensitivity and precision.

It is another object of the invention to provide a scanning interference electron microscope capable of performing micro-analysis of samples, i.e., analyzing and evaluating micro-areas thereof in terms of crystalline quality and element composition while concurrently measuring and evaluating the magnetic property of such microareas.

In carrying out the invention and according to one aspect thereof, there is provided a scanning interference electron microscope comprising an electron source, a focusing lens, an electron beam deflection system and a biprism. The electron source emits a primary electron beam in a vacuum, the primary electron beam being irradiated and focused by the focusing lens on the surface of a sample. The irradiated spot of the primary electron beam is made to scan the sample surface by the electron beam deflection system. Any of reflected and secondary electrons from the sample surface and of the electron beam transmitted through the sample are so detected as to generate a signal which is used to display a microscopic image of the sample.

The biprism is interposed between the electron source and the electron beam deflection system for separating the primary electron beam into two parts. The focusing lens is interposed between the electron beam deflection system and the sample. One of the two separated electron beam parts is irradiated and focused on the surface of the sample for interaction therewith.

The irradiated spot of the one electron beam part is then made to scan the sample surface by the electron beam deflection system while the other electron beam part is allowed to pass through the vacuum outside the sample without irradiation onto the sample surface. The one electron beam part after the interaction with the sample is made to interfere with the other electron beam part transmitted without such interaction in order to generate interference fringes. The one electron beam part develops a phase difference upon interaction with the sample. The phase difference produces changes in the interference intensity of the interference fringes. These changes are detected as the signal representing the microscopic image of the sample.

The biprism may be of a conventional type having an ultra-fine filament located in the middle of a pair of opposing metal plates. The filament bears a positive or negative voltage while the two opposing metal plates are connected to ground potential.

The focusing lens for focusing the primary electron beam on the sample may illustratively be a magnetic lens group comprising a plurality of magnetic lenses. The current flowing through the exciting coils of these magnetic lenses as well as the polarity of that current may be varied using suitable means.

The primary electron beam scans the sample surface first in the X direction in a line pattern, and then scans the surface in the Y direction in a step pattern, the two directions being perpendicular to each other. The scanning process is repeated so as to obtain a scanning electron microscopic view of the target sample. Under this scheme, the voltage applied to the biprism may be turned on and off in synchronism with the scanning of the primary electron beam in the X and Y directions.

Furthermore, an X-ray detector may be located near the sample to detect fluorescent X-rays emitted from the sample surface.

Below is a more specific description of how the scanning interference electron microscope according to the invention is constructed and operated in principle with reference to FIG. 1. It is assumed as an example that the primary electron beam is irradiated onto a magnetic substance sample and that a phase difference of the electron beam transmitted therethrough is detected so that the magnetic property of the substance may be measured and evaluated.

In a high-vacuum chamber, not shown, a primary electron beam 2 emitted by an electron source 1 is divided by a biprism 3 into a right-hand electron beam $2a$ and a lefthand electron beam $2b$. The two electron beams are then deflected inward and opposite to each other. At a deflection position A, the two electron beams are superposed for interference with each other, thus forming interference fringes $4a$. After this, the electron beams $2a$ and $2b$ are again separated away from each other, then focused by a focusing lens 6.

One electron beam $2a$ is irradiated onto a sample 8 while the other electron beam $2b$ bypasses the sample 8 and proceeds downward through the vacuum. At the deflection position A, the two electron beams $2a$ and $2b$ are deflectively scanned by a deflection system 5 so that the electron beam $2a$ will scan the surface of the sample 8. Then an object lens 9 focuses the electron beam $2a$ transmitted through the sample 8 and the electron beam $2b$ that bypassed the sample and proceeded downward, in such a way that the two beams are again superposed for interference with each other at a position B to form interference fringes $4b$.

An intermediate lens 10 and a projection lens 11 magnify the interference fringes $4b$, with a magnified interference fringe image $4d$ formed on a fluorescent screen 12. At a position C between the intermediate lens 10 and the projection lens 11, the electron beams $2a$ and $2b$ are also superimposed for interference with each other, producing interference fringes $4c$.

If the phase of the electron beam $2a$ incident on any micro-area of the sample 8 is kept unchanged, making the beam $2a$ scan the sample 8 produces no phase difference between the electron beam $2a$ after transmitting through the sample 8 and the electron beam $2b$ that bypasses the sample 8. Thus the interference fringes $4d$ formed on the fluorescent screen 12 are always a representation of the interference fringes $4a$ magnified and projected from the position A.

On the other hand, if the phase of the electron beam $2a$ incident on a micro-area of the sample 8 is changed, a phase difference occurs correspondingly between the electron beam $2a$ having transmitted through the micro-area and the electron beam $2b$ that bypasses the sample 8. As a result, while the electron beam $2a$ is being irradiated onto the micro-area, the interference fringes $4b$, $4c$ and $4d$ at position B, position C and the fluorescent screen 12 individually tend to shift laterally.

For example, where the sample 8 is a magnetic substance, magnetic induction B exists within a distance "d" between the two separated electron beams $2a$ and $2b$ at the sample position. This magnetic induction causes a phase difference of $$\phi = 2\pi(e \cdot t/h) \cdot d \cdot B$$

where "e" is an electron charge, "h" is Planck's constant and "t" is the thickness of the sample 8. If B=1 Wb/m², d=$10^{-7}$m, and t=$2 \times 10^{-8}$m, then the phase difference $\phi$ is $2\pi \times 0.5$. One period of interference fringes (i.e., fringe pitch) corresponds exactly to a phase difference of $2\pi$. Thus on the fluorescent screen 12, the individual fringe positions of the interference fringes $4d$ shift laterally by one-half of a period. It follows that measuring the interference fringes for lateral shifts at various micro-areas of the sample 8 makes it possible to evaluate the magnetic property of a given micro-area of the sample.

Furthermore, masking means may be provided to mask a desired portion of a signal generated by a detector that detects the interference fringes $4d$ on the fluorescent screen 12. This arrangement is intended to convert only the signal having a high intensity of the interference fringes $4d$ into a signal for brightness variation whereby a scanning electron microscopic image is displayed. With this arrangement, when the electron beam $2a$ is incident on that micro-area of the sample which produces the above-mentioned phase difference, the individual positions of the interference fringes $4d$ shift laterally and the detection signal thereof is masked accordingly. Thus the micro-area in question is shown darkly in the scanning electron microscopic image of the sample. In this manner, a two-dimensional distribution image of the magnetic property in the sample is obtained.

If the focusing lens 6 in FIG. 1 is a magnetic lens group, the magnetic field thereof causes the primary electron beams $2a$ and $2b$ to rotate around the lens center axis. The rotation angle is given as $$\theta = 10.62 \times I \cdot N / \sqrt{V} (°)$$

where I is the lens coil current value, N is the number of lens coil windings and V is the acceleration voltage of the primary electron beam 2. Because the value of $I \cdot N / \sqrt{V}$ is generally about 5, the rotation angle $\theta$ after beam passage through one magnetic lens is approximately +53°. If only the direction of the lens coil current flow is reversed, so as to keep constant the condition for focusing the electron beam $2a$ onto the sample 8, then the rotating direction of the electron beam is also reversed. That is, the rotation angle $\theta$ becomes −53°. Therefore, the two separated primary electron beams $2a$ and $2b$ may be rotated by 106° on the sample surface by changing inversely the direction of the coil current through one magnetic lens.

When the focusing lens 6 is made of a plurality of magnetic lenses, the coil current value and the current direction for each of the magnetic lenses may be varied while the condition for focusing the primary electron beam $2a$ onto the sample 8 is kept constant. These operations make it possible to rotate the two separated primary electron beams 2a and 2b by a desired angle over a wide range of angles on the sample surface. This allows the phase difference of the primary electron beam 2a to be measured in various directions of the sample 8.

Where the sample 8 is sufficiently large, the two separated primary electron beams 2a and 2b may both be irradiated onto the sample 8. In such a case, a conventional scanning electron microscope develops a hard-to-decipher double image if it utilizes the detection signal of secondary electrons 13 emitted from the sample surface and the intensity detection signal of the interference fringes 4d as the signal for brightness variation. With this invention, the above drawback is corrected by setting to zero the voltage applied to the biprism 3 so that the primary electron beam 2 is not separated upon irradiation onto the sample. The result is a clear scanning electron microscopic image that is conventionally obtained. That is, when the scanning of the primary electron beam 2a on the sample surface is synchronized with the activation and deactivation of the voltage to the biprism 3, a scanning interference electron microscopic image and a conventional scanning electron microscopic image are concurrently acquired.

Irradiating and focusing the primary electron beam 2a onto the sample 8 causes fluorescent X-rays to be emitted therefrom. When the spectrum of these X-rays is detected, the element analysis of micro-areas in the sample 8 is made available thereby.

In addition, irradiating the primary electron beam 2a onto the sample 8 produces an electron diffraction pattern on the fluorescent screen 12. Detecting that pattern allows micro-areas of the sample 8 to be evaluated for crystalline quality.

Further objects features and advantages of the invention will become more apparent upon a reading of the following description and appended drawings.

DESCRIPTION OF PREFERRED EMBODIMENTS

Figure 1:
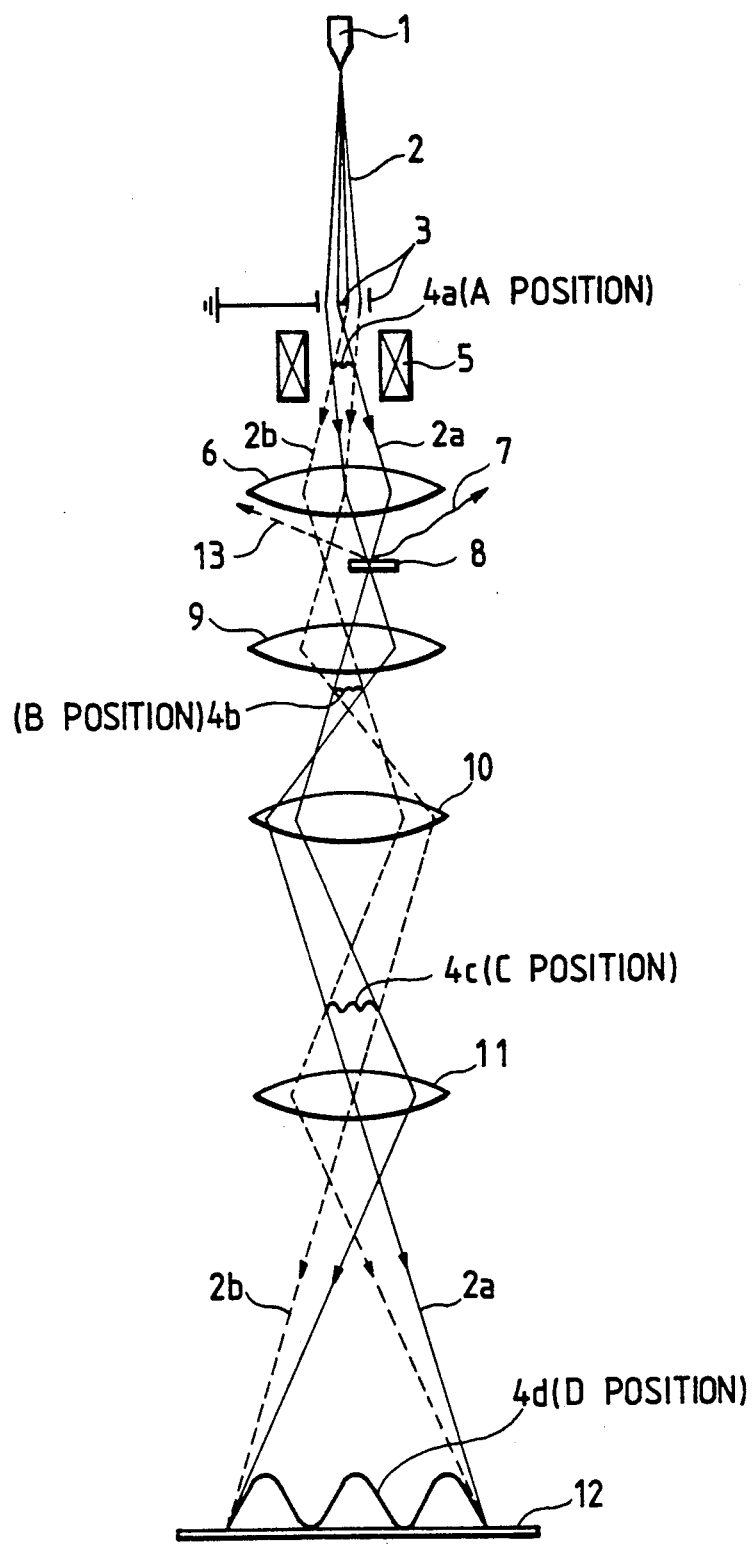
FIG. 1 is a view describing how a scanning interference electron microscope embodying the invention works in principle.
Figure 2:
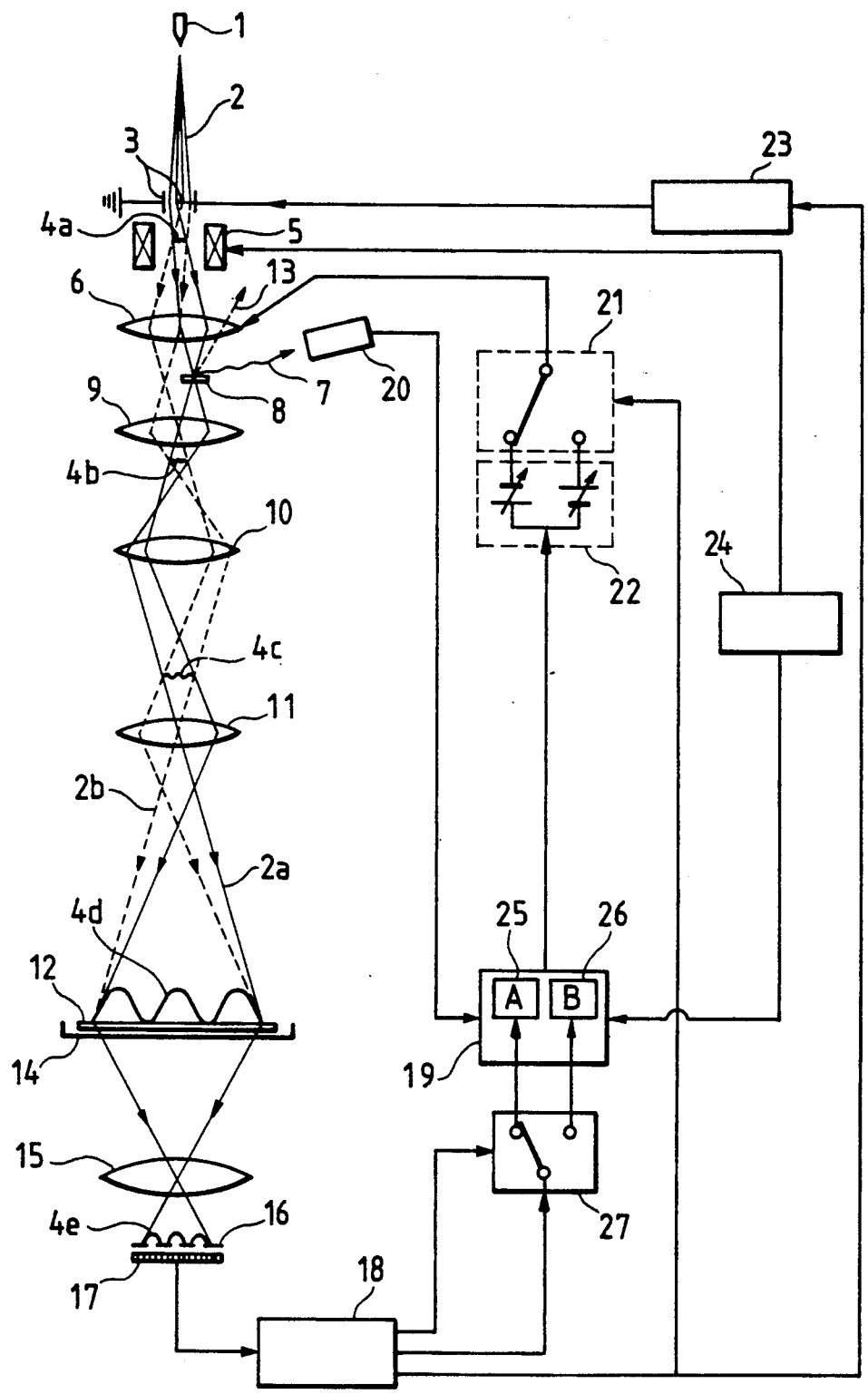
FIG. 2 is a schematic view of a preferred embodiment of the invention.

A preferred embodiment of the invention will now be described in detail with reference to FIGS. 2 through 4. In FIG. 2, the primary electron beam 2 emitted by the electron source 1 is separated by the biprism 3 into two electron beams 2a and 2b. The two separated electron beams 2a and 2b are made to interfere with each other, forming the interference fringes 4a. After this, the focusing lens 6 focuses the two electron beams in such a way that electron beam 2a is irradiated onto the sample 8 while electron beam 2b is allowed to bypass the sample 8 and proceed downward in the vacuum. The object lens 9 focuses the electron beam 2a after transmitting through the sample 8 and the electron beam 2b that bypasses the sample 8, producing the interference fringes 4b. The intermediate lens 10 and the projection lens 11 magnify the interference fringes 4b, with the magnified interference fringe image 4d formed on the fluorescent screen 12.

At this point, a scanning electric power supply 24 activates the deflection system 5 to make the electron beam 2a scan the surface of the sample 8. An optical detector 17 detects the intensity distribution of the magnified interference fringes 4d on the fluorescent screen 12 through a viewing port 14 and an optical lens 15. In front of the optical detector 17 is an aperture mask 16 having parallel stripe-like slits SA with open areas. Of the optical image of interference fringes 4e projected on the aperture mask 16, only that part of the image which has arrived at the detection plane of the optical detector 17 through the slits SA is detected. The detection signal of the optical detector 17 is sent to a display 19 via a computer 18. In turn, the display 19 displays a scanning electron microscopic image of the sample based on the intensity detection signal of the interference fringe image 4e taken as the signal for brightness variation.

Figure 3:
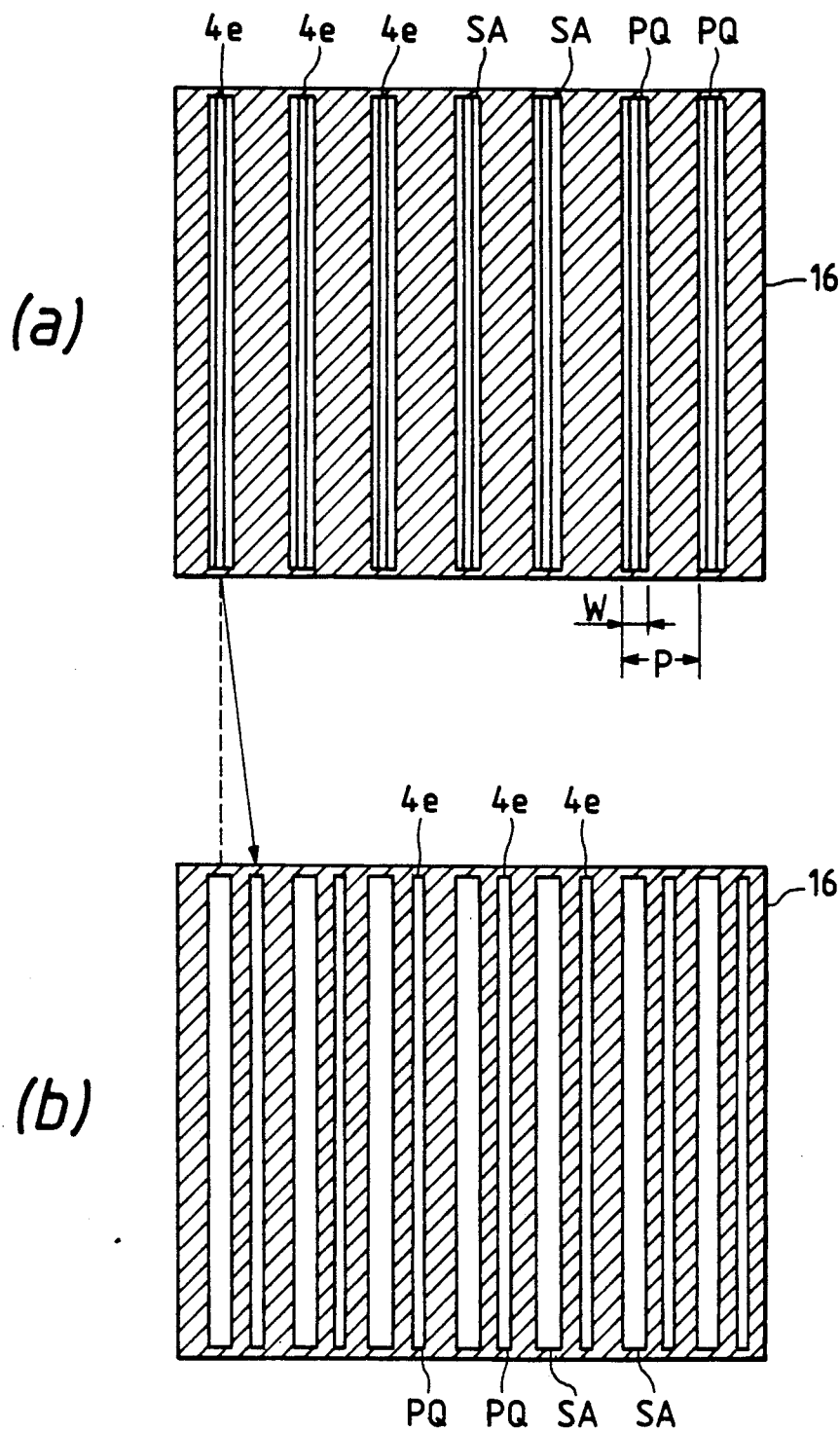
FIG. 3 is a set of schematic views showing how an intensity signal of interference fringes is captured using an aperture mask in connection with the invention.

With the phase of the electron beam 2a held unchanged for any area of the sample 8, the width "w" and pitch "p" of the slits SA are established so that high intensity stripes PQ in the interference fringe image 4e will always be positioned at the center of each slit SA of the aperture mask 16 regardless of the scanning of the electron beam 2a over the sample surface, as shown in FIG. 3 (A). In this setup, when the phase of the electron beam 2a actually changes in a micro-area of the sample 8, the high intensity stripes PQ in the interference fringe image 4e shift laterally at that point. As the high intensity stripes PQ are moving out of the slits SA and being masked, the optical detector 17 fails to detect the light from the stripes PQ. As a result, the micro-area that caused the above phase change of the electron beam 2a is represented darkly in the scanning electron microscopic image of the sample on the display 19.

When the phase of the primary electron beam 2a changes exactly by $2\pi$, the stripes of the interference fringe image 4e shift precisely by one pitch. This allows the high intensity stripes PQ to reappear at the center of each slit SA, raising the detection signal of the optical detector 17. Thus the micro-area that caused the $2\pi$ phase change is represented brightly. The above-described mechanism allows two-dimensional distribution images to represent phase changes of the primary electron beam 2a in each micro-area of the sample as the beam 2a scans the sample surface. In this manner, it is possible to know the two-dimensional distribution of the magnetic property in the sample 8.

To examine in more detail the magnetic property of micro-areas in the sample 8 requires grasping how the primary electron beam 2a changes in phase in various directions on the sample 8. This requirement is met as follows: A focusing lens power supply 22 is used as an adjustable power supply for adjusting the current flowing through the focusing lens 6. While flowing, the lens current is switched in direction using a switch 21. In this arrangement, the primary electron beams 2a and 2b are rotated in various angular directions over the surface of the sample 8 for more detailed examination.

Figure 4:
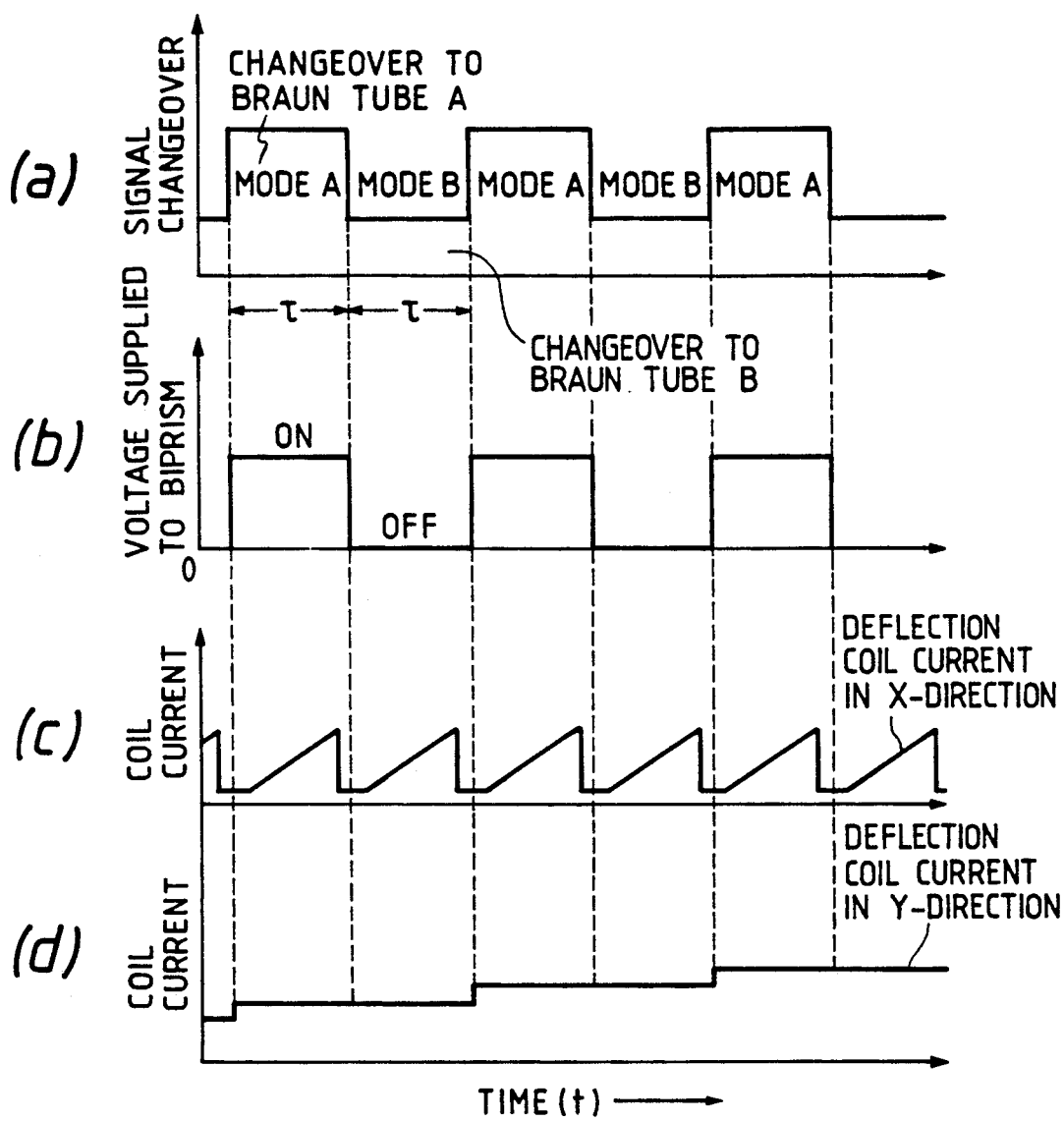
FIG. 4 is a set of timing charts depicting how the scanning of the primary electron beam is illustratively synchronized with the application of a voltage to the biprism in the embodiment.

The sample 8 may happen to be so large that the two primary electron beams 2a and 2b are both irradiated onto the surface thereof. In such a case, a conventional scanning electron microscope develops a hard-to-decipher double image if it utilizes the detection signal of the secondary electrons 13 emitted from the sample surface as well as the intensity detection signal of the interference fringes 4d as the signal for brightness variation. This drawback is corrected as follows:

As depicted in FIG. 4, the primary electron beam 2a irradiated onto the sample 8 is made to scan the surface thereof first in the X direction in a line pattern (FIG. 4 (C)). Following the scanning in the X direction, the sample surface is scanned by the primary electron beam 2a in the Y direction in a step pattern (FIG. 4(D)), the Y direction being perpendicular to the preceding X direction. The scanning in the two directions provides a scanning electron microscopic image of the sample.

Under this scheme, after one pass of step scanning is completed in the Y direction and before the next pass thereof in the same direction starts, two passes of line scanning are carried out in the X direction (FIG. 4 (C)). At this point, a biprism power supply 23 is controlled by the computer 18 in such a way that the biprism 3 is supplied with a predetermined positive voltage during one of the two passes (first pass in FIG. 4 (A)) of line scanning in the X direction (called mode A), and that the biprism 3 receives no voltage (FIG. 4 (B)) during the other pass of line scanning in the X direction (called mode B).

In mode A (i.e., during the first-pass X direction line scanning), the detection signal of the optical detector 17 is input via a signal changeover switch 27 to a brightness variation signal input terminal of a Braun tube (A) 25 in the display 19; in mode B (i.e., during the second-pass X direction line scanning), the detection signal of the optical detector 17 is input via the signal changeover switch 27 to a brightness variation signal input terminal of a Braun tube (B) 26 (see FIG. 4 (A)). With this setup, the screen of the Braun tube (A) 25 shows a scanning interference electron microscopic image containing information about phase changes of the primary electron beam 2a in the sample 8.

The screen of the Braun tube (B) 26 displays an ordinary scanning electron microscopic image that is conventionally obtained when the primary electron beam 2 is not split in two but is irradiated as a single, focused electron beam onto the sample 8. Furthermore, because the scanning interference electron microscopic image in mode A and the scanning electron microscopic image in mode B are displayed on a time division basis at short intervals of $\tau$ the two images are in fact displayed side by side for simultaneous observation.

Where the secondary electrons or reflected electrons 13 coming from the sample 8 are detected, a signal representing that detection may be used as a brightness variation signal. This signal is used to provide a scanning electron microscopic image containing information about the surface contour of the sample 8.

Where the primary electron beam 2 is not split in two but is irradiated as a single, focused electron beam onto the sample 8, the electron beam transmitted through the sample forms a transmission diffraction pattern on the fluorescent screen 12. Observing that diffraction pattern yields information about the crystalline quality of the sample 8 at its point of irradiation.

Where a desired part of the above diffraction pattern is detected for optical intensity, a signal representing that detection may be used as a brightness variation signal. This signal is used to display a scanning transmission electron microscopic image indicating the distribution of crystal grains in the sample 8.

Where the fluorescent X-rays 7 emitted from the irradiated spot of the primary electron beam on the sample 8 are detected by an X-ray detector 20, the intensity of the X-rays emitted by a specific element inside is detected. A signal representing that detected intensity may be used as a brightness variation signal to display a scanning electron microscopic image indicating the distribution of that specific element within the sample 8.

The above embodiment has been described as a transmission-type electron microscope wherein the primary electron beam passes through magnetic substance samples. Alternatively, the invention is also practiced as a reflection-type electron microscope wherein the primary electron beam is reflected by the sample surface. In another alternative, the invention also applies effectively to non-magnetic substance samples as long as they have a property that causes the electron beam to change in phase.

As described, the scanning interference electron microscope according to the invention detects lateral shift of interference fringes caused by phase changes of the focused electron beam in the sample, and converts the shift into a detection signal for displaying a scanning interference electron microscopic image. A major advantage of this scheme is that it detects with high sensitivity the magnetic property of micro-areas in the sample for evaluation of high precision. As another advantage, the characteristic of the focused electron beam is utilized concurrently to acquire and evaluate the crystalline property and element composition of the micro-areas.

While a preferred embodiment of the invention has been described using specific terms, such description is for illustrative purposes only, and it is to be understood that changes and variations may be made without departing from the spirit or scope of the following claims.

What is claimed is:

1. A scanning interference electron microscope comprising:
   an electron source for emitting a primary electron beam in a vacuum;
   an electron beam deflection system;
   a focusing lens interposed between said electron beam deflection system and a sample to be scanned; and
   a biprism interposed between said electron source and said electron beam deflection system for separating said primary electron beam into two parts so that one of the two separated electron beam parts is irradiated and focused by the focusing lens onto the surface of said sample;
   wherein an irradiated spot of said one electron beam part on said sample is made to scan said sample surface by said electron beam deflection system while the other electron beam part bypasses the sample through the vacuum without irradiation onto said sample surface;
   wherein any of reflected and secondary electrons emitted from said sample surface and said one electron beam part transmitted through said sample are so detected as to generate a signal, said signal being used to display a microscopic image of said sample;
   wherein said one electron beam part after the interaction with said sample is arranged to interfere with said other electron beam part transmitted without said interaction in order to generate interference fringes; and wherein said one electron beam part develops a phase difference with respect to said other electron beam part upon said interaction with said sample, said phase difference being accompanied by interference fringe intensity changes that are detected as said signal representing said microscopic image of said sample.

2. A scanning interference electron microscope according to claim 1, wherein said focusing lens is a magnetic lens group comprising a plurality of magnetic lenses, said microscope further comprising means for changing the vector quantity of a current flowing through exciting coils of said magnetic lenses.

3. A scanning interference electron microscope according to claim 1, further comprising means for controlling said electron beam deflecting system to scan said one electron beam part on said sample surface first in the X direction in a line pattern and then in the Y direction in a step pattern, the line pattern scanning and the step pattern scanning being made to repeat in synchronism with the supply and nonsupply of a voltage directed to said biprism.

4. A scanning interference electron microscope according to claim 1, further comprising an X-ray detector located near said sample to detect X-rays emitted therefrom as a result of said one electron beam part scan.

5. A scanning interference electron microscope according to claim 1, further comprising an optical detector for detecting the intensity of a diffraction pattern formed by said one electron beam part transmitted through said sample.

6. A scanning interference electron microscope according to claim 5, further comprising an aperture mask, interposed between said sample and said optical detector, for passing only part of the image of the interference fringes to said optical detector.

7. A scanning interference electron microscope according to claim 6, wherein said aperture mask includes a plurality of slits having respective slit centers that are positioned so that all interference fringe maxima passing through the aperture mask pass through the respective slit centers.

8. A scanning interference electron microscope according to claim 1, wherein said one electron beam part is focused onto the surface of the sample approximately at a focal plane of the focusing lens.

* * * * *